US012790200B2

(12) United States Patent
Liukku et al.

(10) Patent No.: US 12,790,200 B2
(45) Date of Patent: Nov. 10, 2026

(54) STOPPER BUMP ON ROTOR

(71) Applicant: Murata Manufacturing Co., Ltd., Nagaokakyo (JP)

(72) Inventors: Matti Liukku, Helsinki (FI); Pekka Lehtinen, Vantaa (FI)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 395 days.

(21) Appl. No.: 18/534,983

(22) Filed: Dec. 11, 2023

(65) Prior Publication Data

US 2024/0190698 A1 Jun. 13, 2024

(30) Foreign Application Priority Data

Dec. 13, 2022 (EP) .................................... 22213103

(51) Int. Cl.
*B81B 3/00* (2006.01)
*B81B 7/00* (2006.01)

(52) U.S. Cl.
CPC .......... *B81B 3/0051* (2013.01); *B81B 7/0016* (2013.01); *B81B 2201/0235* (2013.01); *B81B 2201/0242* (2013.01); *B81B 2203/056* (2013.01)

(58) Field of Classification Search
CPC ................ B81B 3/0051; B81B 7/0016; B81B 2201/0235; B81B 2201/0242; B81B 2203/056; B81B 2203/058; B81B 3/001
See application file for complete search history.

(56) References Cited

U.S. PATENT DOCUMENTS

2017/0008757 A1 1/2017 Cheng et al.
2020/0270123 A1 8/2020 Cuthbertson et al.
2022/0091154 A1 * 3/2022 Nagel ..................... B81B 3/001

* cited by examiner

*Primary Examiner* — Joseph Ortega
(74) *Attorney, Agent, or Firm* — ArentFox Schiff LLP

(57) ABSTRACT

A microelectromechanical element is provided that includes a motion-limiting structure that prevents a main rotor body from coming into direct physical contact with a stator across a vertical rotor-stator gap. The motion-limiting structure includes a first stopper bump that is a protrusion on the stator that extends towards the rotor. The motion-limiting structure also includes a second stopper bump that is a protrusion on the rotor that extends from the main rotor body towards the stator.

18 Claims, 9 Drawing Sheets

STOPPER BUMP ON ROTOR

CROSS REFERENCE TO RELATED APPLICATIONS

The application claims priority to European Patent Application No. 22213103.9, filed Dec. 13, 2022, the entire contents of which are hereby incorporated by reference.

TECHNICAL FIELD

The disclosure relates to microelectromechanical (MEMS) elements, and more particularly, to MEMS elements where a mobile rotor moves close to a fixed stator. The present disclosure further concerns motion limiters that prevent direct contact between the main rotor body and the stator.

BACKGROUND

Microelectromechanical (MEMS) devices such as accelerometers and gyroscopes often comprise a mass element that is suspended from fixed anchors with a flexible suspension structure that allows the mass element to move in relation to adjacent fixed structures. This mobile mass element may be called a rotor and a fixed device part that is adjacent to the rotor may be called a stator. Such fixed parts may include walls that form an enclosure around the mobile parts of the MEMS device. The movement of the rotor may be measured for example with capacitive measurements where the rotor itself is used as one electrode and a counter-electrode is placed on an adjacent stator.

Direct physical contact between the rotor and the stator is usually not desirable because it may disturb the operation of the device. The rotor and its suspension structure can be dimensioned so that direct contact does not occur in regular operation, but exceptional external shocks may still displace the rotor so much that it comes into direct contact with the stator, causing structural damage, electrical short-circuits or other faults.

Motion limiters can be implemented in MEMS devices to reduce shock damage. For example, FIGS. 1*a* and 1*b* illustrate an existing motion limiter that includes a bump 13 that is attached to the stator 11 and extends from the stator toward the rotor 12. The bump will then be the first part that comes into contact with the rotor in the event of an external shock that moves the rotor 12 in the z-direction. The bump 13 prevents direct contact between the other parts of the rotor 12 and the stator.

However, a general challenge with motion bumps is that the impact between the rotor 12 and the bump 13 can be so hard that it releases debris from the rotor. This debris can disturb device operation. Softer impacts can be achieved by utilizing multiple bumps.

SUMMARY

Accordingly, it is an object of the present disclosure to provide a motion limiter for limiting out-of-plane movement and a method for manufacturing such a motion limiter.

In an exemplary aspect, a microelectromechanical element is provided that includes a mobile rotor that includes a main rotor body and is in a device layer that defines an xy-plane and a z-direction that is perpendicular to the xy-plane; a fixed stator that is adjacent to the mobile rotor and that is separated from the mobile rotor in the z-direction by a rotor-stator gap; and a motion-limiting structure that is configured to prevent the main rotor body from directly contacting the fixed stator across the rotor-stator gap. In this aspect, the motion-limiting structure include a first stopper bump that is a protrusion on the fixed stator that extends towards the mobile rotor, and a second stopper bump that is a protrusion on the mobile rotor that extends from the main rotor body towards the fixed stator.

The exemplary aspects of the present disclosure is based on the idea of having one stopper bump extend from the stator toward the rotor, while the other one extends from the rotor toward the stator. This arrangement allows a variety of out-of-plane motion limiters to be constructed.

BRIEF DESCRIPTION OF THE DRAWINGS

In the following, the disclosure will be described in greater detail by exemplary embodiments with reference to the accompanying drawings, in which.

DETAILED DESCRIPTION

Figure 1A:
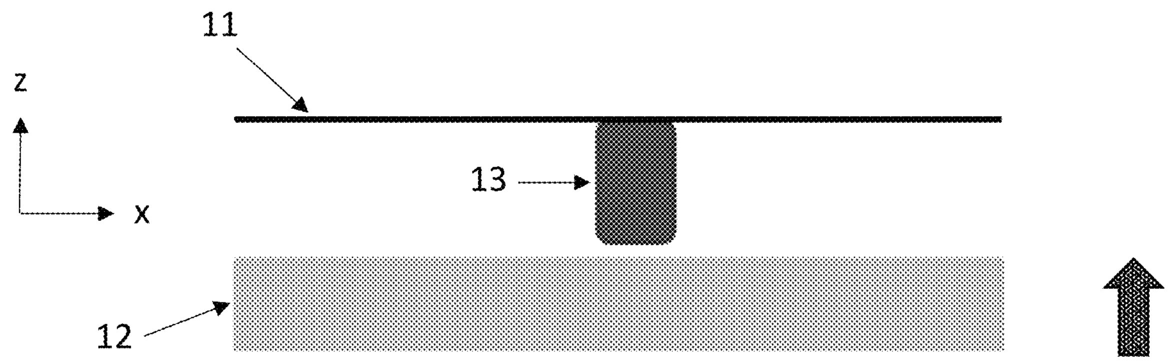
Fig. 1a (Prior Art)
FIGS. 1*a*-1*b* illustrate a conventional motion limiter.
Figure 1B:
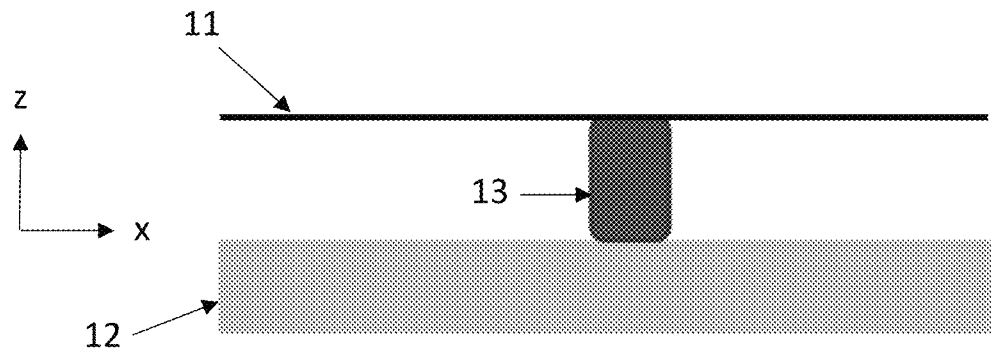
Fig. 1b (Prior Art)

According to an exemplary aspect, a microelectromechanical element is provided that includes a mobile rotor in a device layer. The device layer defines an xy-plane and a z-direction that is perpendicular to the xy-plane. The mobile rotor comprises a main rotor body. The microelectromechanical element also comprises a fixed stator that is adjacent to the mobile rotor and separated from the mobile rotor in the z-direction by a rotor-stator gap.

The microelectromechanical element also comprises a motion-limiting structure that is configured to prevent the main rotor body from coming into direct physical contact with the stator across the rotor-stator gap. The motion-limiting structure comprises a first stopper bump. The first stopper bump is a protrusion on the stator that extends toward the rotor. The motion limiting structure also comprises a second stopper bump. The second stopper bump is a protrusion on the rotor that extends from the main rotor body toward the stator.

According to an exemplary aspect, a stator that is adjacent to the rotor in a MEMS device may be any part of the device layer that (unlike the rotor) remains fixed to a given position with respect to surrounding fixed structures regardless of the movement experienced by the device. The stator may be used as a fixed reference point in a measurement that tracks the movement of the rotor, for example in a capacitive measurement arrangement where a set of electrodes is prepared on the stator and a set of counter-electrodes is prepared on the rotor. A piezoelectric measurement arrangement may alternatively be prepared on a flexible suspender that extends from the stator to the rotor. However, the fixed stator discussed in this disclosure does not have to be a structure that is used for measuring the movement of the rotor. The device may contain multiple stator structures that can be used for different purposes.

The mobile rotor is a part that can move a single body in relation to surrounding fixed structures. The rotor can, for example, be formed in the device layer by etching. A suspension structure comprising flexible springs may be formed between the rotor and the fixed parts of the device layer by etching the device layer. The suspension structure may be significantly more flexible for some kinds of movement than other kinds of movement. The geometry and location of the springs will for example determine whether an external force in the z-direction will set the rotor in rotational motion or translational motion out of the device plane.

The device layer defines a device plane, which is illustrated as the xy-plane in this disclosure. The device plane may for example be defined by a wafer or a layer deposited on a surface, wherein the rotor has been manufactured in said wafer or layer. The rotor may be made of silicon.

The device plane may also be referred to as the horizontal plane. A direction that is perpendicular to the device plane is in this disclosure illustrated with a z-axis, and it may be called the vertical direction or the out-of-plane direction. The words "horizontal" and "vertical" refer in this disclosure only to a plane and to a direction that is perpendicular to that plane. These terms do not imply anything about how the device should be oriented with respect to the earth's gravitational field when the device is manufactured or used. The same also applies to related terms such as "above" and "below", "high" and "low", "up" and "down" for purposes of this disclosure.

In some technical applications, the rotor may be configured to undergo linear out-of-plane motion where the entire rotor moves out of the device plane. In other applications, the rotor may be configured to undergo rotational out-of-plane motion where it rotates about an axis that lies in the device plane. These design options will also influence how the rotor moves under the influence of an external shock in the z-direction. This disclosure presents motion limiters intended for limiting linear and rotational out-of-plane motion, or any other kind of out-of-plane motion.

The motion-limiting structure comprises a first stopper bump and a second stopper bump, and it is configured to prevent the rotor from coming into direct physical contact with the stator. The first and second stopper bumps are protrusions on the stator and the rotor, respectively. The first stopper bump may be formed from a layer of silicon dioxide that is deposited on the stator and then patterned. The second stopper bump may be formed by patterning the rotor itself, or it may be formed by a depositing a layer on the rotor and patterning this layer. It should be appreciated that other options are also possible.

The rotor has a main rotor body, and the purpose of the motion-limiting structure is to prevent this main rotor body from coming into direct physical contact with the stator. In the event of a strong external shock, the contact will instead occur between the first stopper bump and the main rotor body and/or between the second stopper bump and the stator. The places where these two impacts occur can be selected through suitable placement and dimensioning of the first and second stopper bumps. This placement and dimensioning can be selected in a way that minimizes the risk of structural damage.

In an exemplary aspect, the microelectromechanical element may be an accelerometer or a gyroscope. The device part that is the mobile rotor may in some applications be called a mass element, a proof mass or a Coriolis mass. The rotor is in its rest position when no transducing force or external force acts upon it. The rotor may be moved away from its rest position, and for example driven into oscillating movement, by a force transducer built into the MEMS element. The rotor may also be moved away from its rest position by external forces that act on the MEMS element. A shock is an external force that exceeds the force magnitude that the microelectromechanical element was designed to withstand in normal operation.

Figure 2:
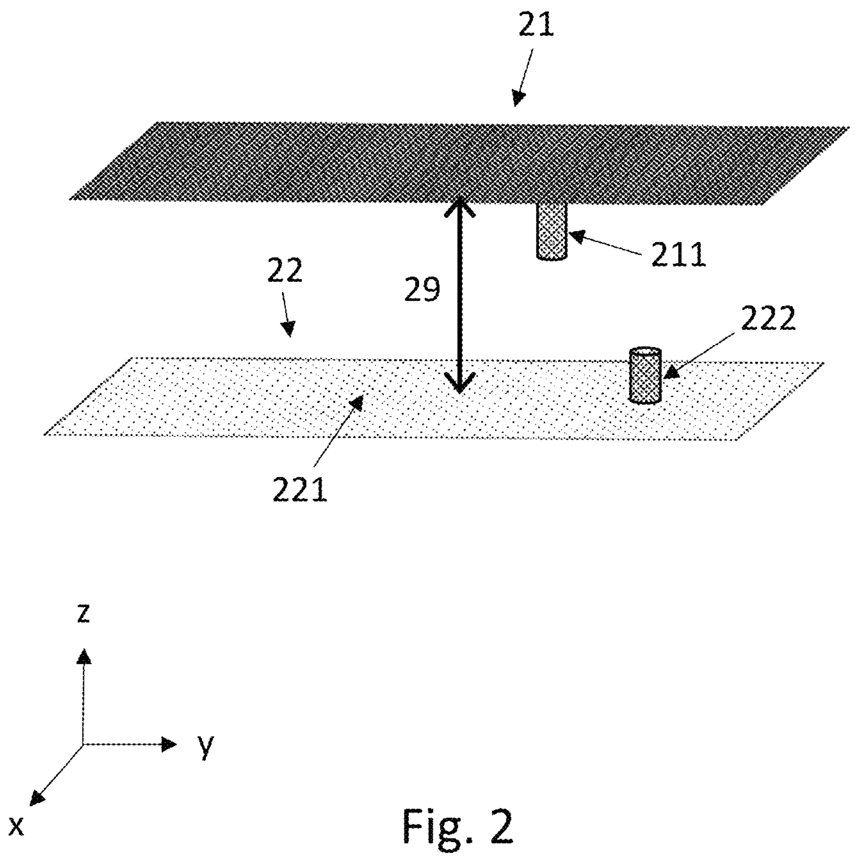
FIG. 2 illustrates a microelectromechanical element with a motion limiter according to an exemplary aspect.

FIG. 2 illustrates schematically a microelectromechanical element according to an exemplary aspect that comprises a mobile rotor 22 and a fixed stator 21. The rotor comprises a main rotor body 221. The element also comprises a fixed stator 21. The rotor and stator are separated by a rotor-stator gap. The purpose of the motion limiter described in this disclosure is to prevent direct contact between the main rotor body 221 and the stator 21 across the rotor-stator gap 29.

The motion limiter comprises a first stopper bump 211. This first stopper bump 211 can for example be formed by depositing an insulating layer on the stator 21 and then patterning the layer. The material of the first stopper bump may for example be silicon dioxide, but many materials can be used in alternative aspects.

The rotor comprises a second stopper bump 222, which forms a part of the motion limiter. This stopper bump protrudes from the main rotor body 221 towards the stator 21. The second stopper bump 222 therefore moves with the rotor and it will only come into contact with the stator if the movement of the rotor toward the stator exceeds a predetermined threshold. The second stopper bump may be formed into rotor by etching the rotor. The rotor may be made of silicon, and the protrusion that forms the second stopper bump may then also be made of silicon. Alternatively, an insulating layer can be deposited and patterned on the surface of the rotor to form the protrusion.

Although this disclosure will primarily discuss microelectromechanical elements that comprise one first stopper bump and one or two second stopper bumps, the number first stopper bumps and the number of second stopper bumps can be freely selected in various exemplary aspects. As would be appreciated to one skilled in the art, the optimal number will depend on many factors, including the size and geometry of the rotor and its suspension and the kind of impact that is desired at each bump.

Figure 3A:
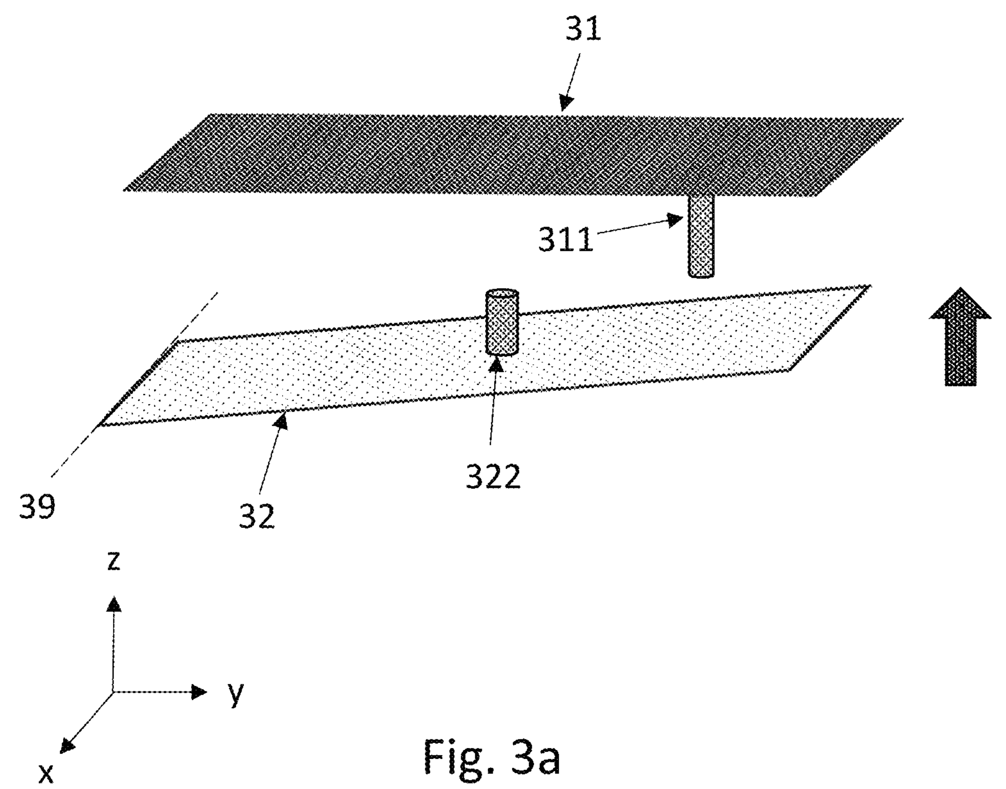
FIG. 3*a* illustrates a rotor that undergoes rotational motion according to an exemplary aspect.

The first and second stopper bumps can be dimensioned and placed so that, when the rotor moves toward the stator in the z-direction and crosses a first displacement threshold, the first stopper bump comes into contact with the rotor but the second stopper bump does not make contact with the stator, and when the rotor continues to move toward the stator in the z-direction and crosses a second displacement threshold, the second stopper bump comes into contact with the stator but the main rotor body does not make contact with the stator. One way to achieve this is to make the first stopper bump longer in the z-direction than the second stopper bump, as FIG. 3*a* illustrates. In other words, in any embodiment of this disclosure the first and second stopper bumps may be dimensioned so that the length of the first stopper bump in the z-direction is greater than the length of the second stopper bump in the z-direction. Other arrangements for achieving first contact at the first stopper bump are also possible in alternative aspects. If the rotor undergoes rotational motion toward the stator, the first and second stopper bumps could have equal lengths, but the first stopper bump may lie further from the rotation axis than the second stopper bump.

The first and second stopper bumps may be dimensioned and placed so that, when the rotor moves toward the stator in the z-direction and crosses a first displacement threshold, the second stopper bump comes into contact with the stator but the first stopper bump does not make contact with the stator, and when the rotor continues to move toward the stator in the z-direction and crosses a second displacement threshold, the first stopper bump comes into contact with the rotor but the main rotor body does not make contact with the stator. One way to achieve this is to make the second stopper bump longer in the z-direction than the first stopper bump. It is noted that other arrangements are also possible for achieving this end.

The expression "when the rotor continues to move toward the stator" means here "in the event that the rotor continues to move toward the stator". If the external shock that moves the rotor past the first displacement threshold (and activates the first stage of the motion-limiting mechanism) is mild, then the first stage may stop the rotor before the second displacement threshold is crossed, and the second stage will not be activated. But in the case of a stronger shock the rotor may keep moving toward the stator even after the first stage was activated, and the movement may continue to the second displacement threshold. These are the events where the second stage of the motion limiter will be activated.

It is noted that in any embodiment presented in this disclosure, the first and second stopper bumps may be positioned and dimensioned so that the upward momentum of the rotor will continue to carry the main body of the rotor toward the stator even after one of the stopper bumps (for example the first) has made first contact (with the rotor). This movement may involve twisting or bending of the main rotor body. The suspension structure may also allow some tilting in the main rotor body after this first impact. The upward movement of the main rotor body may also continue because the first impact was softened by an impact absorber, as described in more detail below with reference to FIG. 4*a*. The twisting, bending or tilting of the rotor may bring the next stopper bump (for example the second) into contact (with the stator) before the movement of the main rotor body stops completely, and before the main rotor body makes physical contact with the stator. In any of these cases, the motion-limiting structure can be called a multi-stage motion limiter.

Moreover, in any embodiment presented in this disclosure, the first and second stopper bumps may be rigid or substantially rigid, so that they do not flex in the vertical z-direction when they come into contact with the opposing part.

As would be appreciated to one skilled in the art, the optimal distances, dimensions and positions of the first and second stopper bumps will depend on the dimensions and structural properties of the rotor, and on the design of the flexible suspension structure of the rotor that determines the movement of the rotor.

The movement of the rotor in the z-direction toward the stator can, for example, be rotational movement about a rotation axis that lies in the xy-plane. This is illustrated in FIG. 3*a*, where reference numbers 31, 32, 311 and 322 correspond to reference numbers 21, 22, 211 and 222, respectively, in FIG. 2. The rotor 32 is suspended from a fixed structure with a suspension arrangement (not illustrated) that allows the rotor to undergo rotational motion about the rotation axis 39.

Figure 3B:
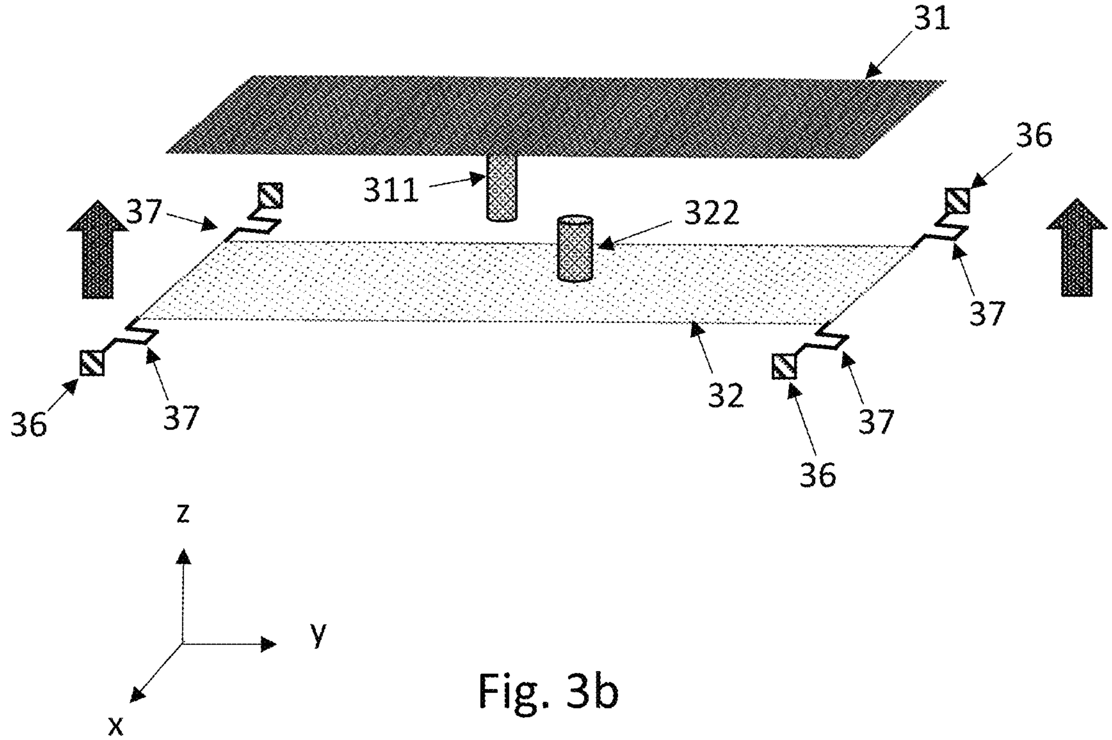
FIG. 3*b* illustrated a rotor that undergoes linear motion according to an exemplary aspect.

Alternatively, the movement of the rotor in the z-direction toward the stator may be linear translational movement in the z-direction. This is illustrated in FIG. 3*b*, where the rotor 32 is suspended from anchor points 36 with a suspension arrangement 37 that is flexible in the z-direction and thereby allows linear movement in this direction.

Regardless of whether the movement of the rotor is rotational or translational, the rotor may comprise an impact absorber. The impact absorber may be attached to the main rotor body with an attachment structure that allows the impact absorber to tilt with respect to the main rotor body. The first stopper bump may be aligned with the impact absorber in the z-direction so that it makes contact with the impact absorber when the rotor crosses the first displacement threshold. In other words, the first stopper bump may be arranged above the impact absorber.

Figure 4A:
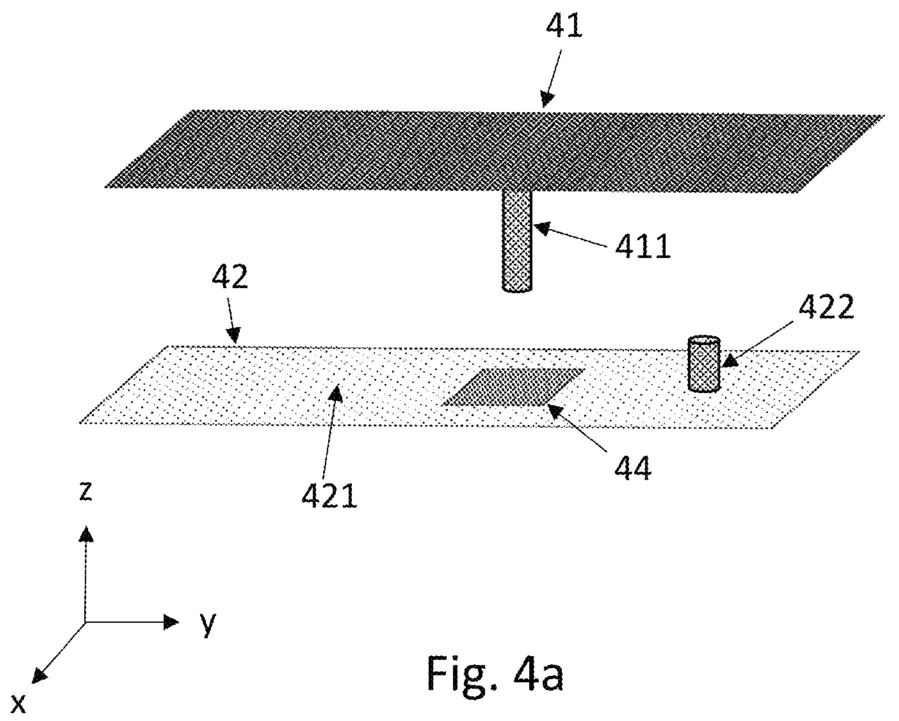
FIGS. 4*a*-4*c* illustrate a rotor with an impact absorber according to exemplary aspects.
Figure 4B:
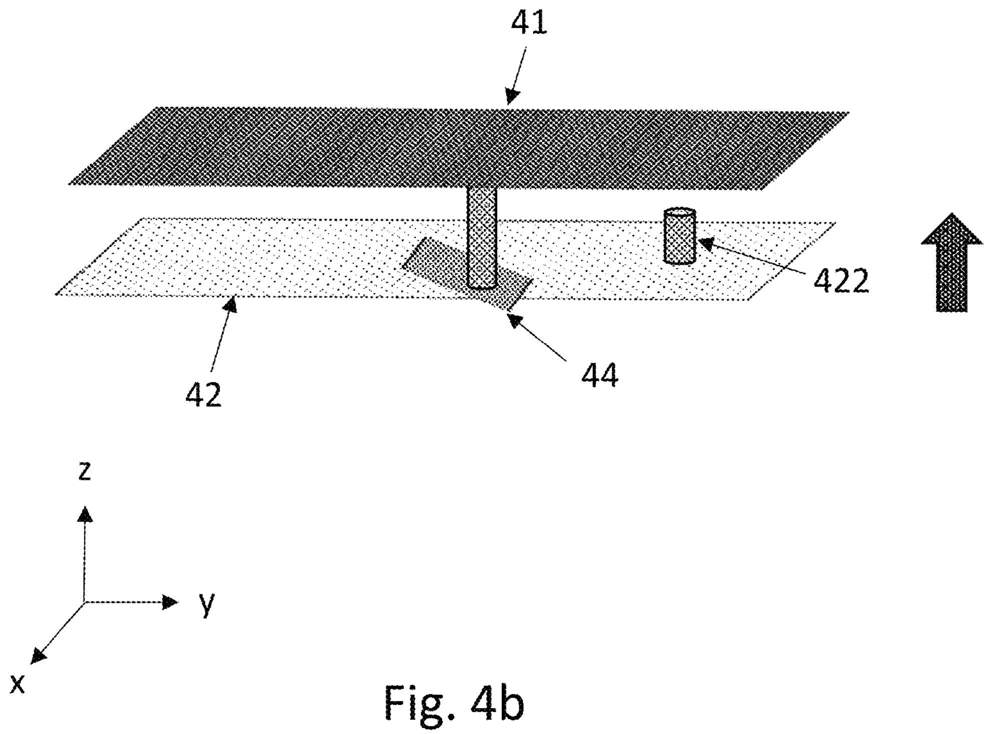

FIG. 4*a* illustrates a microelectromechanical element where reference numbers 41, 42, 411, 421 and 422 correspond to reference numbers 21, 22, 211, 221 and 222, respectively, in FIG. 2*a*. The rotor 42 also comprises an impact absorber 44. The impact absorber 44 is attached to the main rotor body 421 with an attachment structure (not illustrated) that allows the impact absorber to tilt upon when the first stopper bump 411 makes contact with it, as FIG. 4*b* illustrates. The first impact is thereby softened by the impact absorber. The impact absorber 44 allows the first stopper bump 411 to decrease the upward momentum of the rotor 42 without causing a hard impact on the surface of the rotor 42.

FIG. 4*b* illustrates linear translation of the rotor 42 toward the stator 41, but an impact absorber can also be utilized when the rotor moves in rotational out-of-plane movement toward the stator.

Figure 4C:
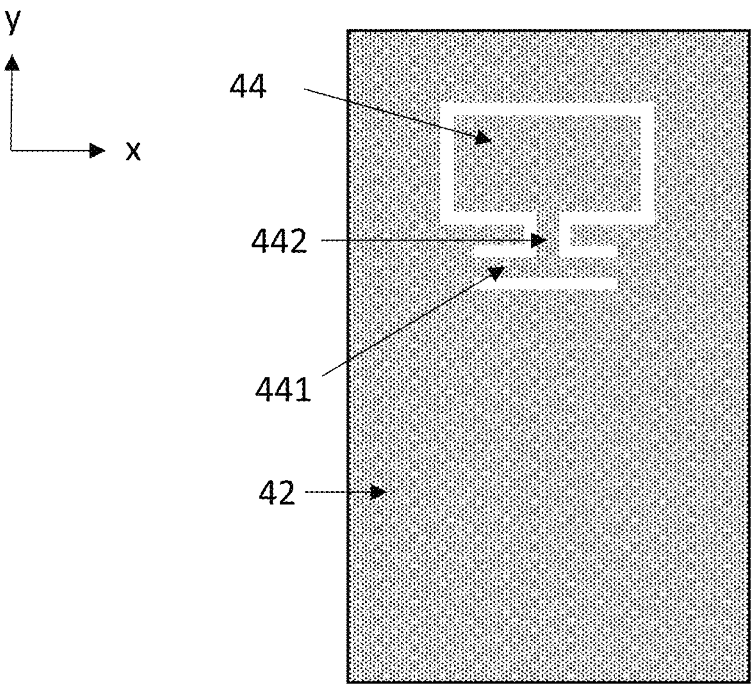

FIG. 4*c* illustrates a possible attachment structure for the impact absorber. The attachment structure can comprise a torsionally flexible first beam 441 that determined the tilting axis of the impact absorber. One or more second beams 442 may extend from the first beam 441 to the impact absorber in the direction that is perpendicular to the first beam. An impact absorber can be implemented in any embodiment presented in this disclosure, and it can be constructed on the main rotor body so that it is aligned with the first stopper bump in the z-direction. A separate impact absorber can be constructed for each first stopper bump if multiple first stopper bumps are used.

In many applications where the rotor undergoes rotational out-of-plane movement toward the stator, the movement of the rotor can be measured with electrodes placed on both sides of the rotation axis. If the rotor is made of a semiconducting material, such as silicon, the rotor itself may be used as one measurement electrode, and counter-electrodes may be arranged for example on the stator. A separate measurement can be performed with each counter-electrode.

Figure 5A:
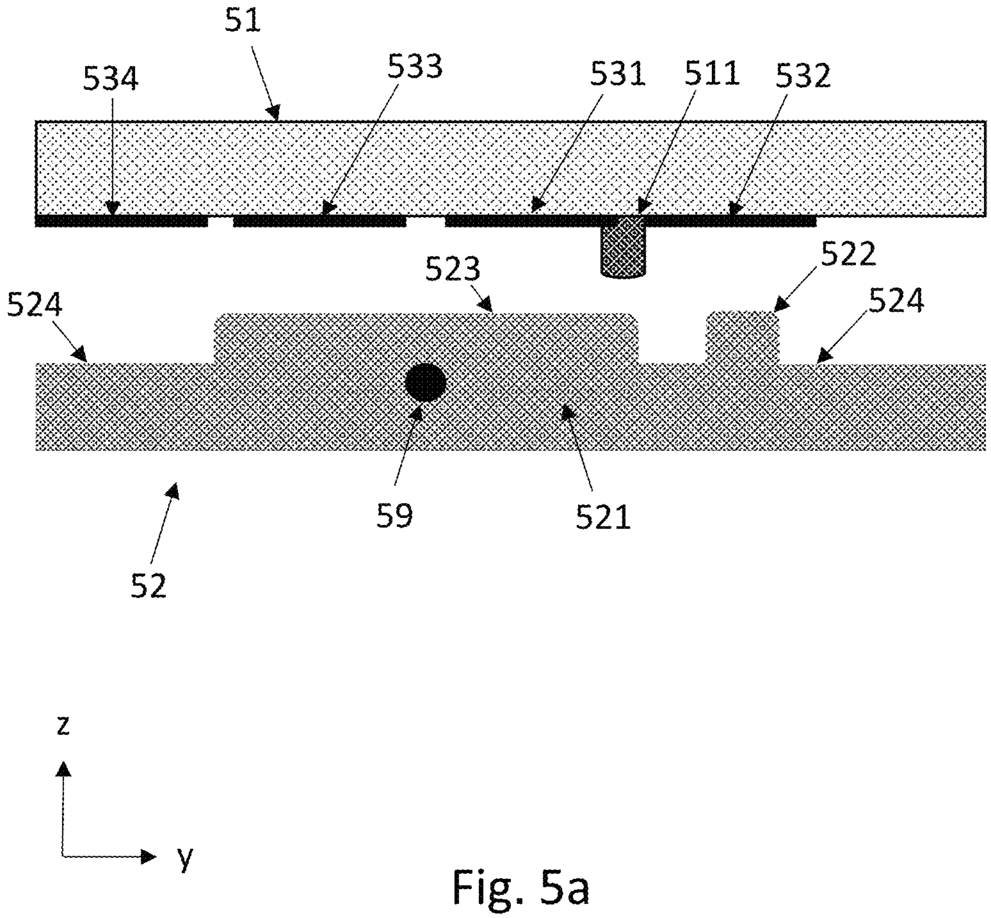
FIGS. 5*a*-5*d* illustrate rotors with two surface regions that have different z-coordinates according to exemplary aspects.

FIG. 5*a* illustrates a microelectromechanical element where reference numbers 51, 511, 52, 522 and 59 correspond to reference numbers 31, 311, 32, 322 and 39, respectively, in FIG. 3*a*. Reference number 521 indicates the main rotor body. The element comprises four counter-electrodes 531-534 on the surface of the stator 51 that faces the rotor 52. First counter-electrode 531 lies close (in the y-direction) to the rotation axis 59 on a first side (right side in FIG. 5*a*) of the rotation axis 59. Second counter-electrode 532 lies further away from the rotation axis 59 on the first side of the rotation axis 59. Third counter-electrode 533 lies close to the rotation axis 59 on a second side (left side in FIG. 5*a*) of the rotation axis 59. Fourth counter-electrode 534 lies further away from the rotation axis 59 on the second side of the rotation axis 59.

If the top surface of the rotor is flat, the gap between the rotor surface and the counter-electrode changes significantly faster further away from the rotation axis than close to the rotation axis as the rotor rotates out of the xy-plane. The relationship between the amplitude of the rotational displacement and the amplitude of the measurement signal can then be quite nonlinear.

It can be advantageous to shape the rotor, for example by etching, so that its top surface comprises two different levels in the z-direction. This option is illustrated in FIG. 5*a*. The rotor comprises a first surface region 523 and a second surface region 524 that face the stator. The first surface region 523 lies closer to the rotation axis 59 than the second surface region 524. The rotor surface is closer to the stator surface in the first region 523 than in the second surface region 524, so that the z-coordinate of the rotor surface is greater in the first surface region 523 than in the second surface region 524. The second stopper bump 522 lies in the second surface region 524.

The z-coordinate of the top of the second stopper bump 522 may be equal to the z-coordinate of the rotor surface in the first surface region 523, as FIG. 5*a* illustrates. This can be achieved by performing an etching process where the top surface of the rotor is recessed throughout the second surface region 524, except for the areas where one or more second stopper bumps will be located. The method for manufacturing the rotor illustrated in FIG. 5*a* may comprise performing a local-oxidation-of-silicon (LOCOS) process on the regions of the device layer that will form the second surface region. A second stopper bump 522 formed in a LOCOS process may have a slightly rounded shape without sharp edges, as FIG. 5*a* illustrates. This can reduce the risk of damage when this stopper bump comes into contact with the stator. Two consecutive LOCOS processes may alternatively be performed. This allows the z-coordinate of the first surface region 523 to be different (greater or smaller) than the z-coordinate of the top of the second stopper bump 522.

Figure 5B:
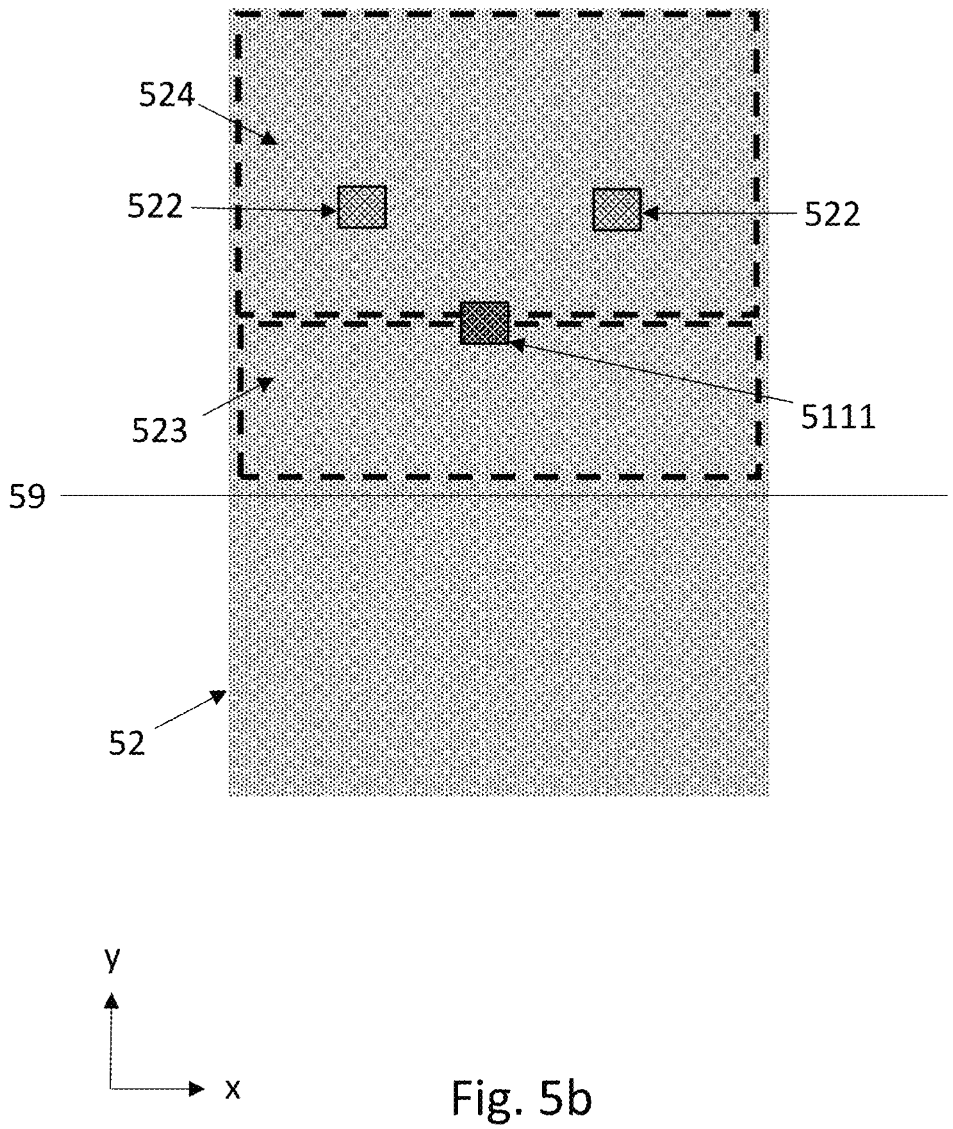

FIG. 5*b* illustrates how the first and second stopper bumps 511 and 522 and the first and second surface regions 523 and 524 may be arranged in the xy-plane. Only the parts of the first and second surface regions that lie on the upper side of the rotation axis 59 in FIG. 5*b* have been marked in FIG. 5*b*, since that side of the axis is where the stopper bumps are located. It is noted that in any embodiment presented in this disclosure, stopper bumps could alternatively be arranged on both sides of the rotation axis 59.

The first and second surface regions 523-524 are illustrated with dashed lines in FIG. 5*b*. The first surface region 523 may be aligned in the z-direction with the counter-electrode 531 and the second surface region 524 may be aligned in the z-direction with the counter-electrode 532, as FIG. 5*a* illustrates. In other words, the counter-electrodes may be arranged above the first and second surface regions, respectively. Two second stopper bumps 522 are illustrated within the second surface region 524. The projection 5111 of the first stopper bump 511 onto the surface of the rotor is also illustrated.

As FIG. 5*b* illustrates, the projection 5111 of the first stopper bump 511 onto the rotor 52 may for example lie in the middle of the rotor in the x-direction, which is the direction parallel to the rotation axis 59. Alternatively, the first stopper bump could lie on either side of the middle. More than one first stopper bumps may also be used. The microelectromechanical element may for example comprise one first stopper bump aligned with one side (left in FIG. 5*b*) of the rotor and another first stopper bump aligned with the opposite side (right) of the rotor.

The first stopper bump 511 partly overlaps with the first (531) and second (532) counter-electrodes in the yz-cross-section of the stator 51 in FIG. 5*a*. However, the first and second counter-electrodes may in practice be arranged around the first stopper bump in the xy-plane, so that no counter-electrode is present where the first stopper bump is located. Similarly, an opening can be made in the second counter-electrode 532 to ensure that the second stopper bump 522 comes into contact with an insulating part of the stator 51. Direct contact between the second stopper bump 522 and the second-counter-electrode 532 could short-circuit the measurement. However, events where this contact occurs are expected to be rare, and a short-circuiting impact may for this reason be acceptable. The second counter-electrode 532 would in this case not need to be pattern at all.

The first stopper bump may be at least partly aligned with the first surface region in the z-direction. In other words, the first stopper bump may be arranged above the first surface region. FIG. 5*b* illustrates a device where the projection 5111 of the first stopper bump on the main rotor body lies is aligned with the interface between the first surface region 523 and the second surface region 524. Alternatively, the projection of the first stopper bump could lie entirely within the first surface region 523.

Figure 5C:
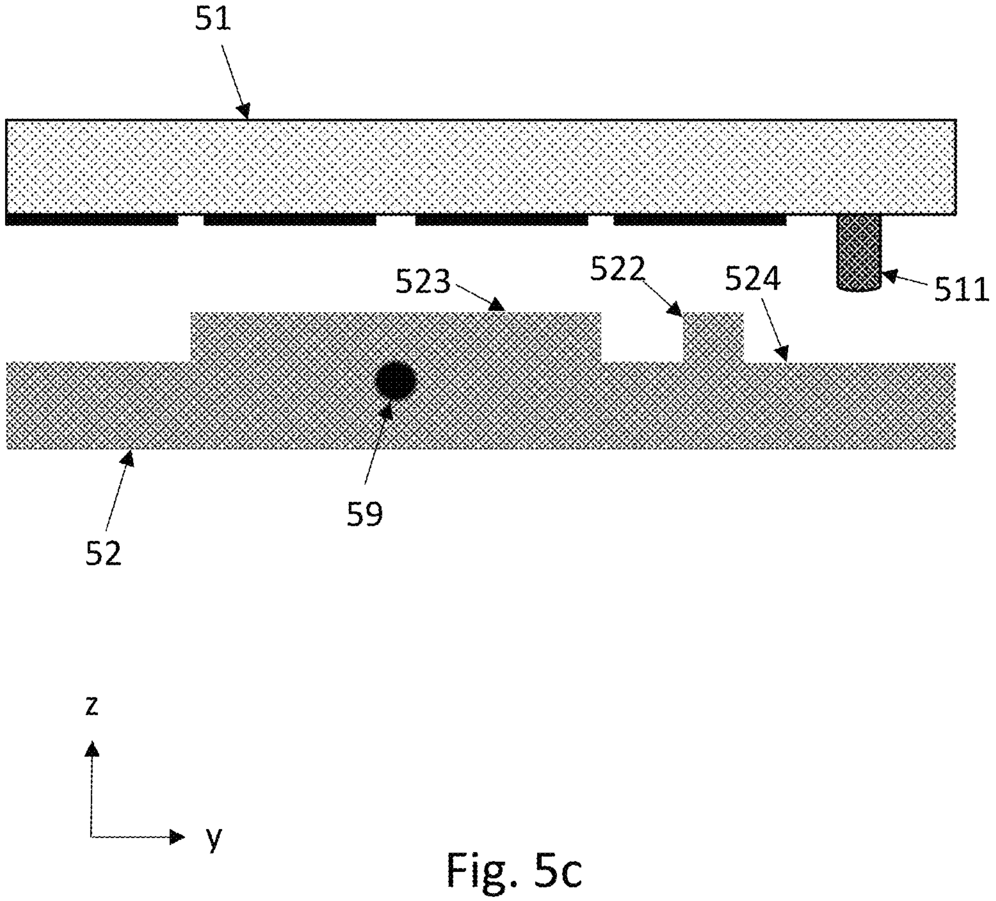
Figure 5D:
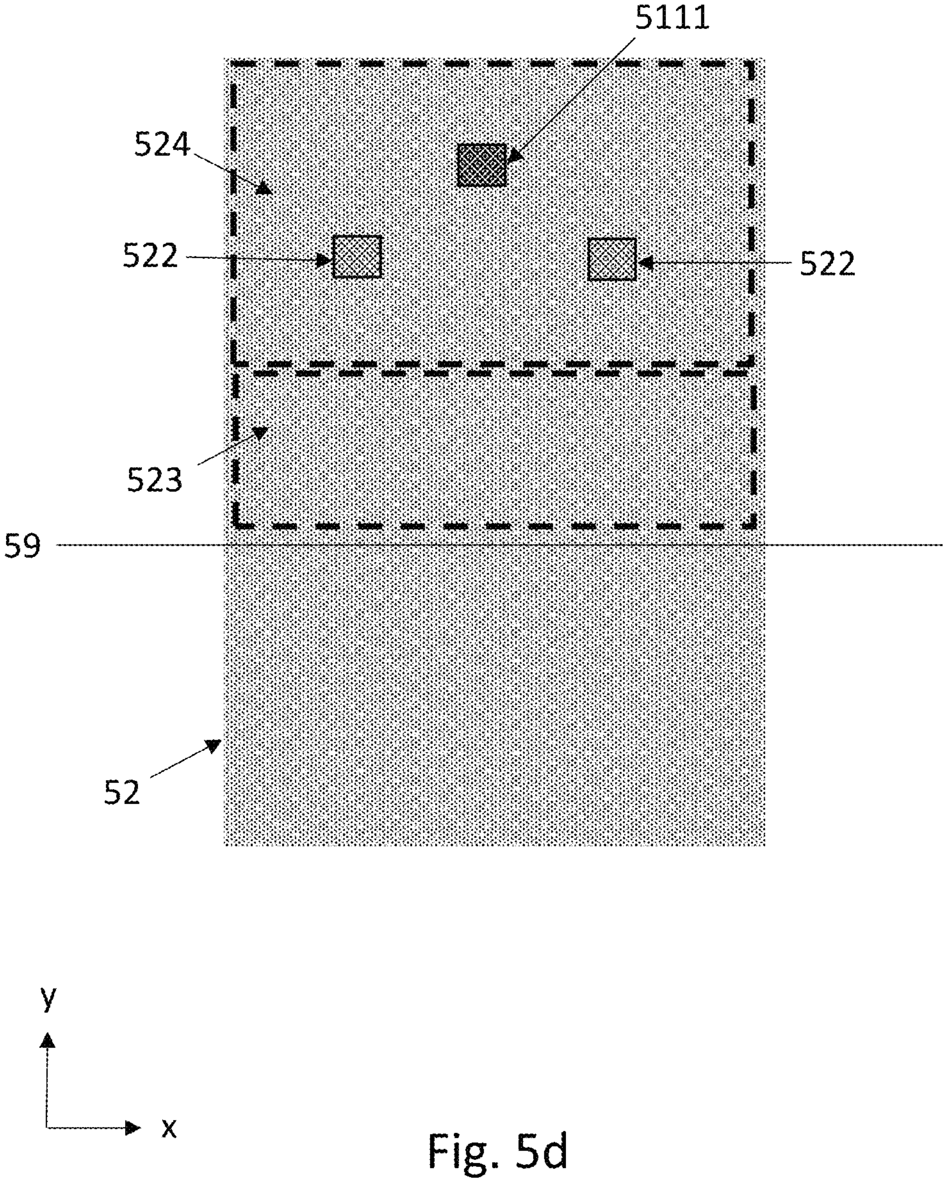

The first stopper bump may be aligned with the second surface region in the z-direction. The first stopper bump is in this case arranged above the second surface region. This option is illustrated in FIG. 5*d*, where the second stopper bumps 522 are also in the second surface region 524.

In general, in any embodiment of this disclosure, the first and second stopper bumps can be placed so that each first stopper bump lies further away from the rotation axis than each second stopper bump, as FIG. 5*b* illustrates. Alternatively, the first and second stopper bumps can be placed so that each second stopper bump lies further away from the rotation axis than each first stopper bump, as FIGS. 5*c* and 5*d* illustrate.

In an exemplary aspect, it is also possible to position the second stopper bump in the first surface region (this option has not been illustrated). The top surface of the rotor will then have to be recessed to multiple levels, so that the first and second surface regions and the top of the second stopper bump are all on different vertical levels. As mentioned earlier two consecutive LOCOS processes may be performed to achieve this objective.

In general, it is noted that the exemplary embodiments described above are intended to facilitate the understanding of the present invention and are not intended to limit the interpretation of the present invention. The present invention may be modified and/or improved without departing from the spirit and scope thereof, and equivalents thereof are also included in the present invention. That is, exemplary embodiments obtained by those skilled in the art applying design change as appropriate on the embodiments are also included in the scope of the present invention as long as the obtained embodiments have the features of the present invention. For example, each of the elements included in each of the embodiments, and arrangement, materials, conditions, shapes, sizes, and the like thereof are not limited to those exemplified above and may be modified as appropriate. It is to be understood that the exemplary embodiments are merely illustrative, partial substitutions or combinations of the configurations described in the different embodiments are possible to be made, and configurations obtained by such substitutions or combinations are also included in the scope of the present invention as long as they have the features of the present invention.

What is claimed:

1. A microelectromechanical element, comprising:

a mobile rotor that includes a main rotor body and is in a device layer that defines an xy-plane and a z-direction that is perpendicular to the xy-plane;

a fixed stator that is adjacent to the mobile rotor and that is separated from the mobile rotor in the z-direction by a rotor-stator gap; and a motion-limiting structure that is configured to prevent the main rotor body from directly contacting the fixed stator across the rotor-stator gap, the motion-limiting structure including:

a first stopper bump that is a protrusion on the fixed stator that extends towards the mobile rotor, and a second stopper bump that is a protrusion on the mobile rotor that extends from the main rotor body towards the fixed stator, wherein:

the mobile rotor comprises a first surface region and a second surface region that face the fixed stator, the first surface region lies closer to a rotation axis of the mobile rotor than the second surface region, a rotor surface of the mobile rotor is closer to a surface of the fixed stator in the first surface region than in the second surface region, and a top surface of the second stopper bump is coplanar with the rotor surface of the mobile rotor in the first surface region.

2. The microelectromechanical element according to claim 1, wherein the first and second stopper bumps are dimensioned and disposed such that when the mobile rotor moves towards the fixed stator in the z-direction and crosses a first displacement threshold, the first stopper bump comes into contact with the mobile rotor but the second stopper bump does not contact the fixed stator.

3. The microelectromechanical element according to claim 2, wherein the first and second stopper bumps are further dimensioned and disposed such that when the mobile rotor continues to move towards the fixed stator in the z-direction and crosses a second displacement threshold, the second stopper bump comes into contact with the fixed stator but the main rotor body does not contact with the fixed stator.

4. The microelectromechanical element according to claim 3, wherein the mobile rotor further comprises an impact absorber that is attached to the main rotor body with an attachment structure that allows the impact absorber to tilt with respect to the main rotor body.

5. The microelectromechanical element according to claim 4, wherein the first stopper bump is aligned with the impact absorber in the z-direction so that the first stopper bump contacts the impact absorber when the mobile rotor crosses the first displacement threshold.

6. The microelectromechanical element according to claim 1, wherein the first and second stopper bumps are dimensioned and disposed so that when the mobile rotor moves towards the fixed stator in the z-direction and crosses a first displacement threshold, the second stopper bump comes into contact with the fixed stator but the first stopper bump does not contact the fixed stator.

7. The microelectromechanical element according to claim 6, wherein the first and second stopper bumps are further dimensioned and disposed such that when the mobile rotor continues to move toward the fixed stator in the z-direction and crosses a second displacement threshold, the first stopper bump comes into contact with the mobile rotor but the main rotor body does not contact the fixed stator.

8. The microelectromechanical element according to claim 1, wherein a movement of the mobile rotor in the z-direction towards the fixed stator is rotational movement about a rotation axis that lies in the xy-plane.

9. The microelectromechanical element according to claim 1, wherein the second stopper bump lies in the second surface region.

10. The microelectromechanical element according to claim 9, wherein the first stopper bump is above the first surface region relative to the z-direction.

11. The microelectromechanical element according to claim 9, wherein the first stopper bump is above the second surface region relative to the z-direction.

12. The microelectromechanical element according to claim 11, wherein the first and second stopper bumps are disposed so that the first stopper bump lies farther away from the rotation axis than the second stopper bump.

13. The microelectromechanical element according to claim 11, wherein the first and second stopper bumps are disposed so that the second stopper bump lies farther away from the rotation axis than the first stopper bump.

14. A microelectromechanical element comprising:

a mobile rotor that includes a main rotor body and is in a device layer;

a fixed stator that is separated from the mobile rotor by a rotor-stator gap; and a motion-limiting structure that is configured to prevent the main rotor body from directly contacting the fixed stator across the rotor-stator gap, the motion-limiting structure including:

a first stopper bump that is a protrusion on the fixed stator that extends towards the mobile rotor, and a second stopper bump that is a protrusion on the mobile rotor that extends from the main rotor body towards the fixed stator;

wherein:

the mobile rotor comprises a first surface region and a second surface region that face the fixed stator, the first surface region lies closer to a rotation axis of the mobile rotor than the second surface region, a rotor surface of the mobile rotor is closer to a surface of the fixed stator in the first surface region than in the second surface region, and a top surface of the second stopper bump is coplanar with the rotor surface of the mobile rotor in the first surface region.

15. The microelectromechanical element according to claim 14, wherein the first and second stopper bumps are dimensioned and disposed such that when the mobile rotor moves towards the fixed stator and crosses a first displacement threshold, the first stopper bump comes into contact with the mobile rotor but the second stopper bump does not contact the fixed stator.

16. The microelectromechanical element according to claim 15, wherein the first and second stopper bumps are further dimensioned and disposed such that when the mobile rotor continues to move towards the fixed stator and crosses a second displacement threshold, the second stopper bump comes into contact with the fixed stator but the main rotor body does not contact with the fixed stator.

17. The microelectromechanical element according to claim 16, wherein the mobile rotor further comprises an impact absorber that is attached to the main rotor body with an attachment structure that allows the impact absorber to tilt with respect to the main rotor body.

18. The microelectromechanical element according to claim 17, wherein the first stopper bump is aligned with the impact absorber so that the first stopper bump contacts the impact absorber when the mobile rotor crosses the first displacement threshold.

* * * * *